United States Patent
Park (10) Patent No.: US 6,855,600 B2
(45) Date of Patent: Feb. 15, 2005

(54) METHOD FOR MANUFACTURING CAPACITOR

(75) Inventor: Won-kyu Park, Daegu-shi (KR)

(73) Assignee: Hynix Semiconductor Inc., Gyunggi-do (KR)

(*) Notice: Subject to any disclaimer, the term of this patent is extended or adjusted under 35 U.S.C. 154(b) by 39 days.

(21) Appl. No.: 10/331,514

(22) Filed: Mar. 5, 2003

(65) Prior Publication Data

US 2004/0033660 A1 Feb. 19, 2004

(30) Foreign Application Priority Data

Jul. 16, 2002 (KR) .................................. 10-2002-0041815

(51) Int. Cl.[7] .................... H01L 21/336; H01L 21/4763
(52) U.S. Cl. .................. 438/259; 438/624; 438/629
(58) Field of Search ............................. 438/253, 259, 438/396, 624, 628, 629

(56) References Cited

U.S. PATENT DOCUMENTS

| | | | |
|---|---|---|---|
| 6,348,259 B1 | 2/2002 | Hilarius et al. | 428/323 |
| 6,355,519 B1 | 3/2002 | Lee | 438/250 |
| 2002/0025453 A1 * | 2/2002 | Tatsumi | 428/697 |

* cited by examiner

*Primary Examiner*—Hsien Ming Lee
(74) *Attorney, Agent, or Firm*—Marshall, Gerstein & Borun LLP (57) ABSTRACT

The present invention realizes high integration by utilizing an aluminum oxide as a capacitor insulating layer having a high dielectric constant, improving characteristics of a semiconductor device by using a low temperature vapor deposition and a low temperature annealing, improving leakage current characteristics by utilizing titanium as an upper electrode of the capacitor and reduces manufacturing costs by simplifying the capacitor manufacturing process. Therefore, the present invention is very useful and effective.

9 Claims, 9 Drawing Sheets

Fig 1a

Prior Art.

Fig 1b

Prior Art.

Fig 1c

Prior Art.

Fig 1d

Prior Art.

Fig 1e

Prior Art

Fig 1f

Prior Art

Fig 1g

Prior Art

Fig 1h

Prior Art

Fig 1i

Prior Art

Fig 1j

Prior Art.

METHOD FOR MANUFACTURING CAPACITOR

BACKGROUND OF THE INVENTION

1. Field of the Invention

The present invention relates to a method for manufacturing a capacitor, and more particularly, to a method for manufacturing a capacitor capable of realizing a high integration by utilizing an aluminum oxide as a capacitor insulating layer having a high dielectric constant, improving characteristics of a semiconductor device by using a low temperature vapor deposition and a low temperature annealing, improving leakage current characteristics by utilizing titanium as an upper electrode of the capacitor and reducing manufacturing costs by simplifying the capacitor manufacturing process.

2. Description of the Related Art

Generally, a capacitor plays a role in storing electrical charges and supplying charges required to operate a semiconductor device, it tends to decrease the size of the unit cell with high integration of the semiconductor device, whereas it tends to slightly increase the capacitance required to operate the semiconductor device.

Thus, as the high integration of the semiconductor device is realized, scaling down the capacitor is required, however, there is a limit in storing the electrical charges, whereby the capacitor shows a problem in the high integration in comparison to its size.

As a result, each manufacturer has diversely changed the structure of capacitor to store electrical charges, there are various methods to increase the charges to be stored in the capacitor, e.g., a method utilizing a material with a high dielectric constant as a capacitor dielectric for increasing the charges of the capacitor, a method reducing the thickness of a dielectric material for increasing the charges of the capacitor, a method increasing the area of the capacitor for increasing the charge of the capacitor or the like, however, recently the method which increases the area of the capacitor has been widely employed to increase the charge of the capacitor.

Accordingly, if the capacitor is approximately classified in view of the structure of a charge storage electrode, there are two type of structures: one is a stacked structure of the electrode to obtain a wide area of the capacitor by stacking a number of layers on a narrow area for storing the electrical charges and the other is a trench structure which forms a trench in a semiconductor substrate to a predetermined depth to form the capacitor in the trench for storing the electrical charges speed.

FIGS. 1a to 1j show a method for forming a capacitor by utilizing a trench structure selected among conventional capacitor manufacturing methods. The conventional capacitor manufacturing method is described hereinafter.

Figure 1A:
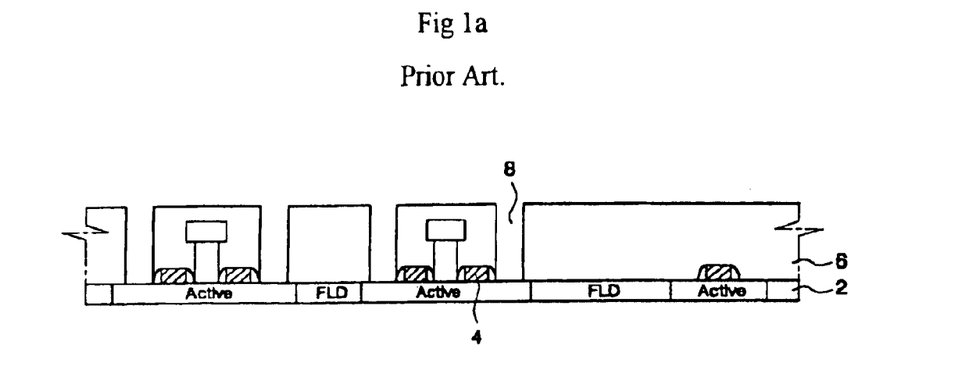
FIGS. 1a to 1j are cross-sectional views showing a conventional method for manufacturing a capacitor sequentially.

As shown in FIG. 1a, a field region and an active region are separately formed on a semiconductor substrate 2 by performing various processes, and then, a transistor 4 is formed on the active region.

And, an interlayer insulating layer 6 is formed on the resultant structure to thereby obtain a planarization and contact holes are formed to connect the active region of the semiconductor substrate 2 through a mask etching process.

Figure 1B:
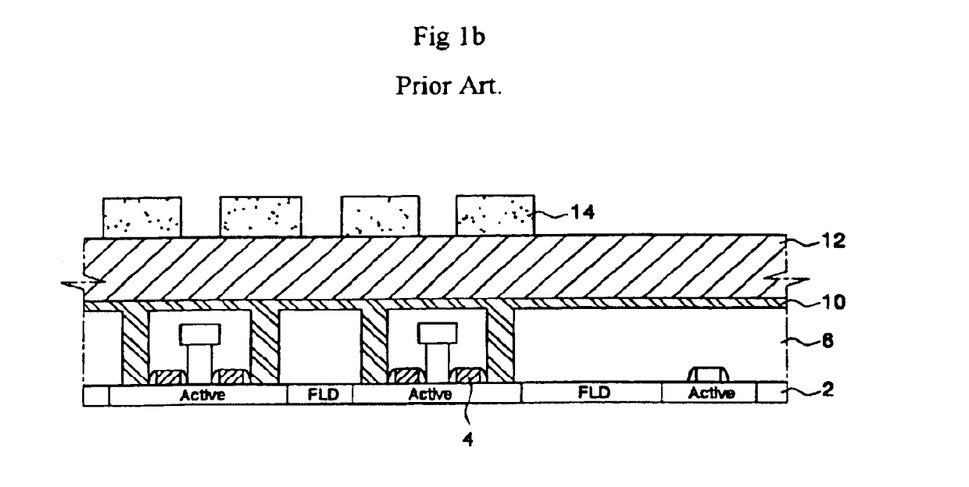
Figure 1C:
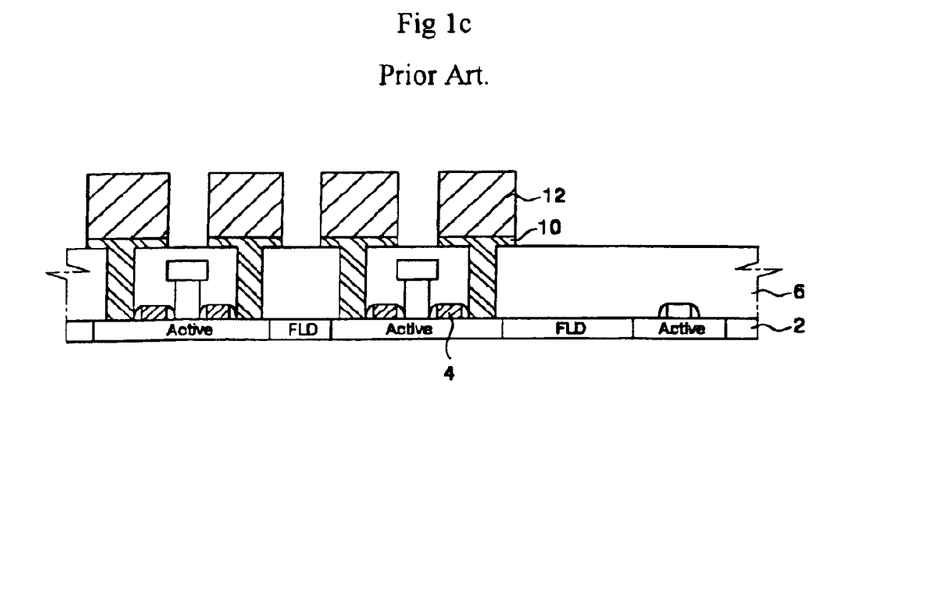

Thereafter, as shown in FIGS. 1b and 1c, a doped poly layer 10 is formed on the resultant structure which serves as a lower electrode of the capacitor and a phospho-silicate glass (PSG) insulating layer 12 is formed thereon.

Subsequently, a photoresist layer 14 is formed on the resultant structure, a portion to define a capacitor is remained by patterning and the capacitor is formed by a dry etching.

Figure 1D:
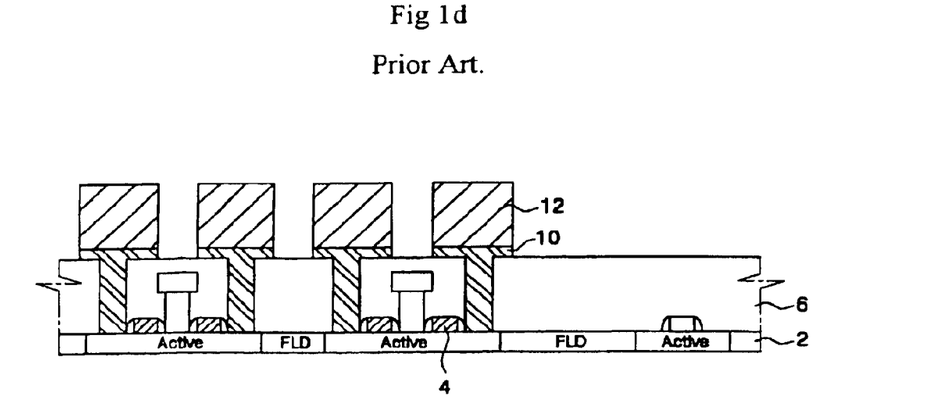

And then, as shown in FIG. 1d, a doped poly layer 10 is formed on the resultant structure.

Figure 1E:
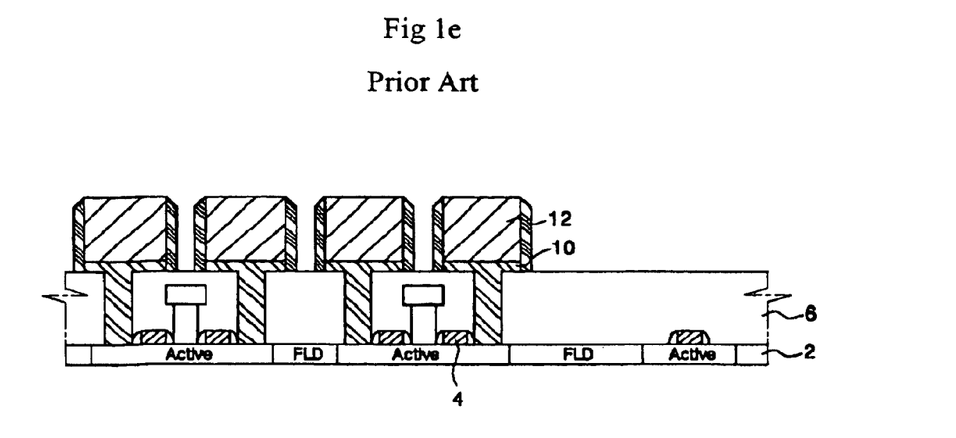

In the next step, as shown in FIG. 1e, the doped poly layer 10 at the remaining portion except a side portion of the capacitor is removed by dry etching a front of the resultant structure.

Figure 1F:
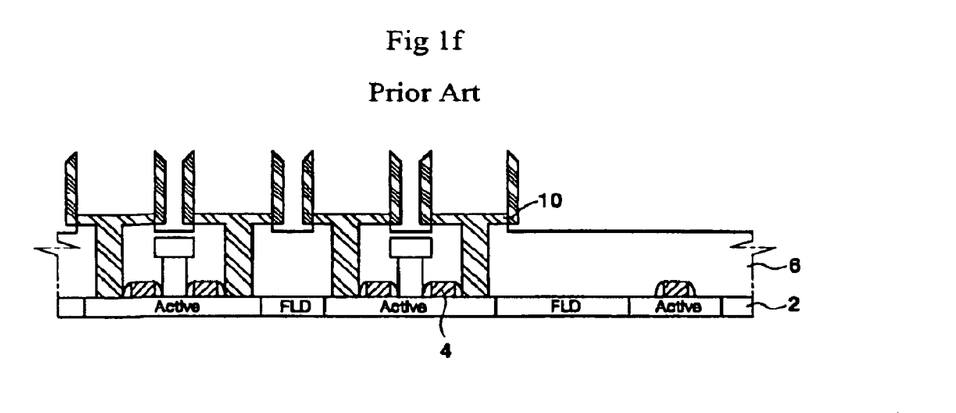

As shown in FIG. 1f, a low electrode of the capacitor to form a spatial part of a cylindrical shape is formed by removing the PSG insulating layer 12 remaining at a center portion of the capacitor in the resultant structure through a wet etching.

Figure 1G:
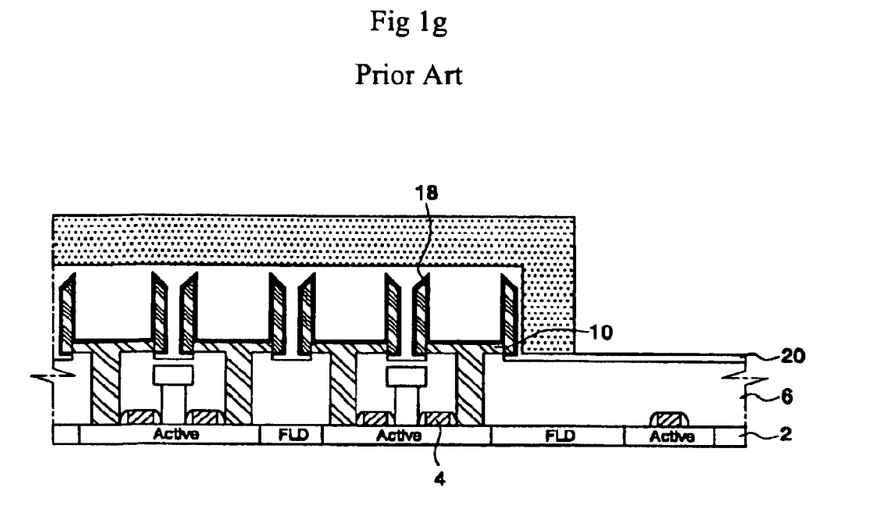

Thereafter, as shown in FIG. 1g, a native oxide is grown at the lower electrode of the capacitor, a nitride layer is deposited on the native oxide and a capacitor insulating layer 18 is formed by oxidizing the nitride layer.

After the doped poly layer 20 is formed on the resultant structure, the region of the capacitor is blocked by a photoresist layer 22.

Figure 1H:
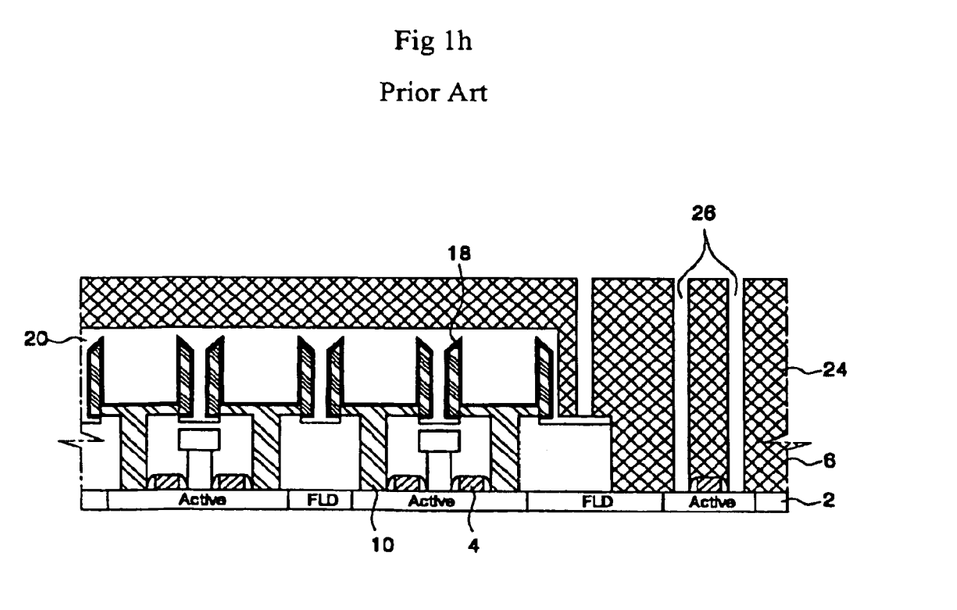

In an ensuing step, as shown in FIG. 1h, after a second interlayer insulating layer 24 is formed on the resultant structure, contact holes 26 are formed in the second interlayer insulating layer 24 by using a photolithography and an etching processes.

Figure 1I:
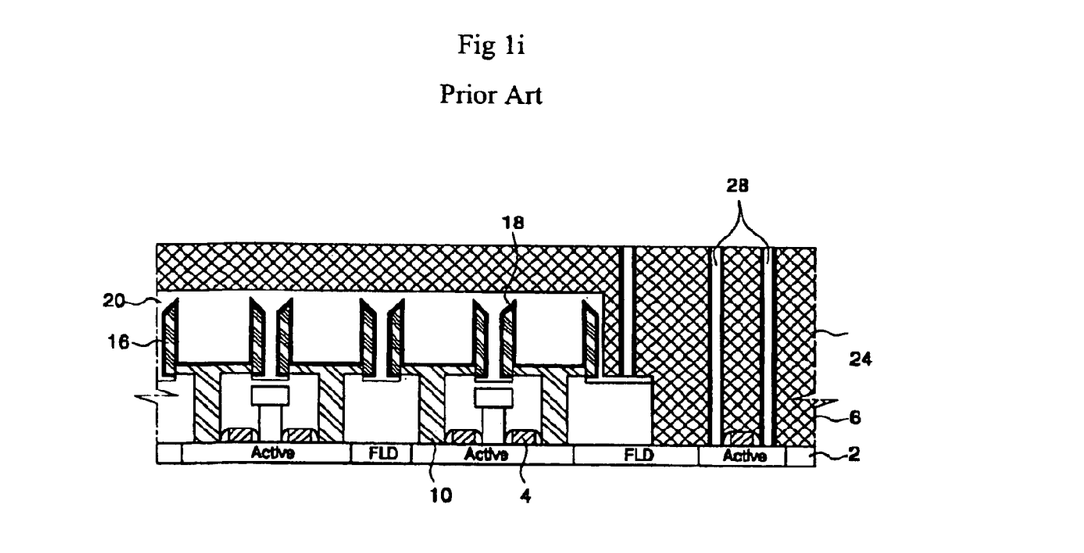

In the following step, as shown in FIG. 1i, a plug metal, especially made of tungsten, is filled in the contact holes 26 so as to bury the contact holes 26, thereby forming a plurality of metal plugs 28.

Figure 1J:
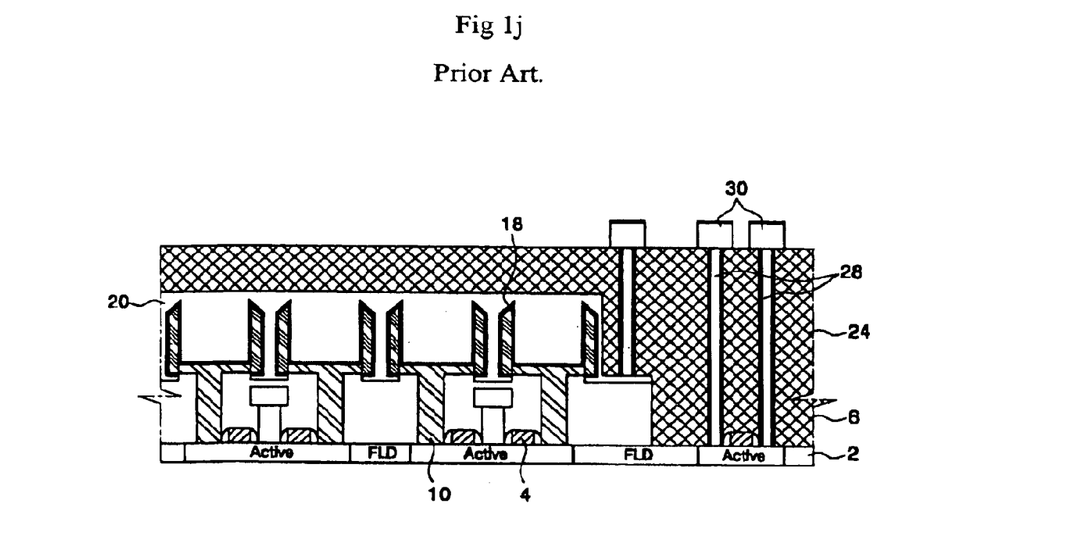

As shown in FIG. 1j, metal lines 30 are formed on the metal plugs 28 to connect the metal plugs 28 thereto and to use as an interconnection.

In accordance with the conventional capacitor manufacturing method described above, it requires a number of processes to generate a capacitor, which, in turn, cause a number of fails to be created by the defects and particles generated during the processes; and therefore, a repair circuit is required to compensate for the defects and particles to thereby causing problems in increasing the area of chip due to the repair circuit.

Also, it is difficult to implement dry etching and bury the plug metal, since the contact holes formed for connecting the metal lines for use in an interconnection have depths of approximately 20000 Å.

Further, since the position at the center is etched to expose both an upper electrode of a capacitor and the active region of the silicon substrate during formation of contact holes at the second interlayer insulating layer, the contact characteristics of the capacitor deteriorate when in contact with a safe active region and it is difficult to control the lower transistor characteristics due to the high temperature applied during oxidation of the nitride layer.

SUMMARY OF THE INVENTION

It is a major object of the present invention to provide a method for manufacturing a capacitor capable of realizing a high integration by utilizing an aluminum oxide as a capacitor insulating layer having a high dielectric constant, improving characteristics of a semiconductor device by using a low temperature vapor deposition and a low temperature annealing, improving the leakage current characteristics by utilizing titanium as an upper electrode of the capacitor and reducing the manufacturing cost by simplifying the capacitor manufacturing process.

In accordance with one aspect of the present inventions there is provided a method for manufacturing a capacitor comprising the steps of: after a field region and an active region are formed on a semiconductor substrate, forming contact holes for connecting with the active region by stacking a first interlayer insulating layer on the entire region; after a first connecting layer is stacked on the resultant structure to improve a contact characteristics with the active region, filling metal in such a way that the contact holes are buried and forming first plugs in the contact holes by front etching; forming a metal layer is formed in the resultant structure, after a photoresist pattern is formed on the portion to be formed on the capacitor, and forming the capacitor by etching the metal layer; after a capacitor insulating layer is formed on the top and side surface of the capacitor, forming a second connecting layer on the resultant structure; after a first metal line is formed on the resultant structure, patterning by stacking the photoresist layer so as to block a capacitor region; exposing the first interlayer insulating layer by sequentially etching the first metal line and the second connecting layer through the patterned photoresist; after a second interlayer insulating layer is formed on the resultant structure, forming contact holes connected to the first metal line by a photolithography process; and after the second plugs are formed in the contact holes, forming a second metal line for use in an interconnection.

Preferably, the first connecting layer is a stacked layer including titanium (Ti)/titanium nitride (TiN) formed in a range of 50~150 Å/100~200 Å, respectively.

Preferably, after a tungsten is formed by a chemical vapor deposition method, the first plugs are formed by patterning using a dry etching.

Preferably, the metal layer made of aluminum is formed at a temperature ranging from 300 to 500° C. at a thickness ranging from 3000 to 4000 Å.

Preferably, dry etching is utilized when the metal layer is etched by the photoresist layer.

Preferably, the capacitor insulating layer is formed by annealing an aluminum oxide ($Al_2O_3$) layer at a temperature ranging from 200 to 400° C. at a thickness ranging from 30 to 100 Å. The second connecting layer made of titanium (Ti) is formed at a thickness of 50~150 Å.

Preferably, the first metal line is a stack layer made of Al/Ti/TiN. The first metal line is formed by using a dry etching.

BRIEF DESCRIPTION OF DRAWINGS

Other objects and aspects of the present invention will become apparent from the following description of embodiments with reference to the accompanying drawings in which.

DESCRIPTION OF THE PREFERRED EMBODIMENTS

A preferred embodiment of the present invention will now be described with reference to the accompanying drawings.

FIGS. 2a to 2g are cross-sectional views representing a method for manufacturing a capacitor in accordance with a preferred embodiment of the present invention.

Figure 2A:
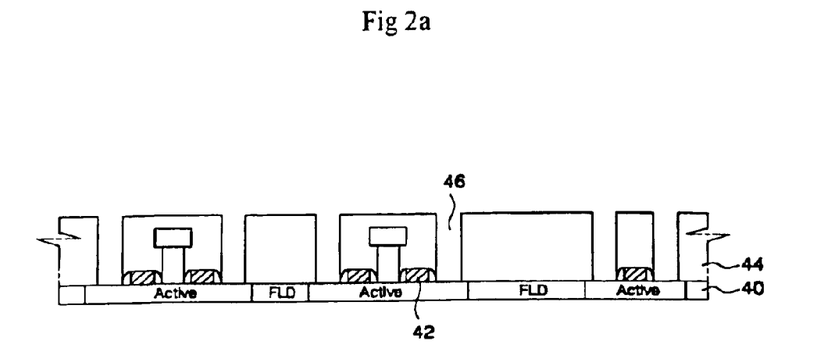
FIGS. 2a to 2g are cross-sectional views representing a method for manufacturing a capacitor in accordance with a preferred embodiment of the present invention.

As shown in FIG. 2a, at first, a semiconductor substrate 40 provided with a substructure of a predetermined configuration is prepared. Then, a field region and an active region are formed on the semiconductor substrate 40 and thereafter a transistor 42 is formed. Then, a first interlayer insulating layer 44 is deposited on the field region, the active region and a predetermined portion of the semiconductor substrate 40 which does not cover the field region and the active region to form contact holes 46 for connecting the active region thereto.

Figure 2B:
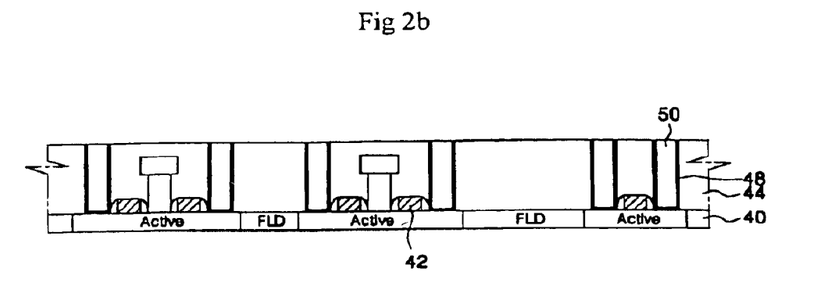

As shown in FIG. 2b, after a first connection layer 48 is formed on the resultant structure to improve the adhesive characteristics with the active region, a metal is formed to bury the contact holes 46 and first plugs 50 are formed in the contact holes 46 by planarizing with the front etching.

The first connection layer 48 is a stack layer including titanium (Ti)/titanium nitride (TiN) formed at a thickness ranging from 50~150 Å/100~200 Å, respectively.

The first plugs 50, after forming a tungsten using a chemical vapor deposition, is formed by patterning using a dry etching.

Figure 2C:
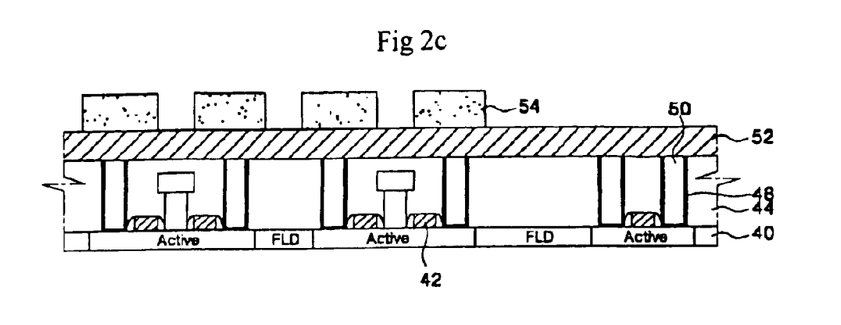

As shown in FIG. 2c, a metal layer 52 is formed on the resultant structure and a pattern is formed by stacking a photoresist layer 54 on a portion to be formed a capacitor thereon.

On the metal layer 52 made of a pure aluminum (Al), it is preferable that the metal layer 52 has a thickness ranging from 3000~4000 Å. Particularly, it is more preferable that the metal layer 52 is formed at a temperature of approximately 400° C. at a thickness of 3500 Å.

Figure 2D:
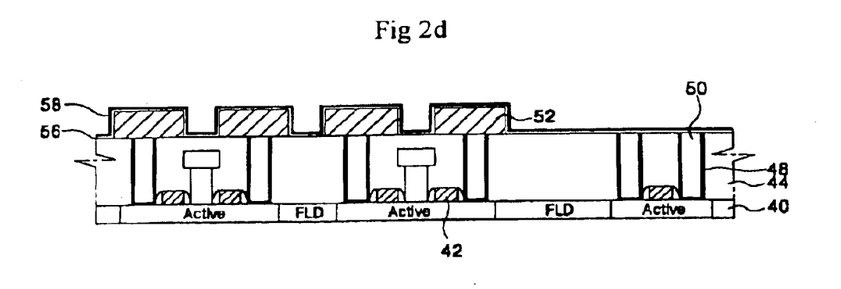

Then, as shown in FIG. 2d, a capacitor is formed by dry etching the metal layer 52 for the photoresist layer 54. Then, a capacitor insulating layer 56 is formed on the top and side surface of the capacitor and a second connection layer 58 is formed on the resultant structure.

The capacitor insulating layer 56 is formed by annealing oxide aluminum ($Al_2O_3$) at an atmosphere of $O_3$ at a temperature ranging from 200~400° C. at a thickness of 30~100 Å

Thereafter, it is preferable that the second connection layer 58 is made of titanium (Ti) and is formed with a thickness ranging from 50 to 150 Å.

Figure 2E:
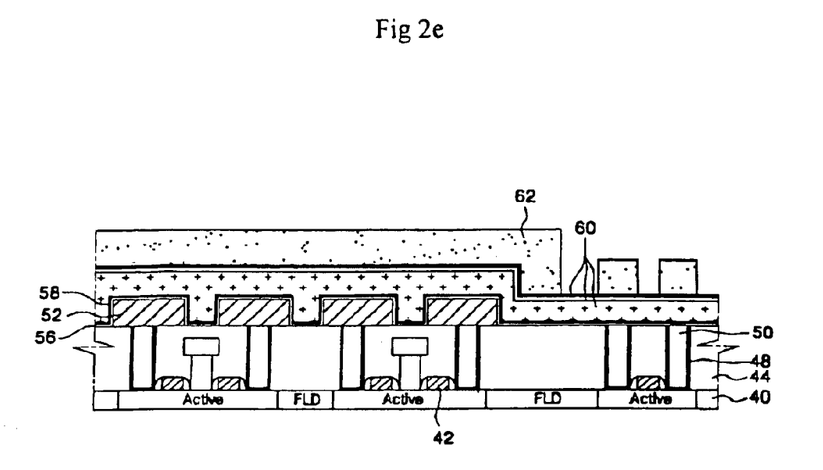

As shown in FIG. 2e, after a first metal line 60 is formed on the resultant structure, a photoresist layer 62 is formed on the first metal line 60 and the photoresist layer 62 is patterned into a predetermined configuration so as to block the capacitor region.

The first metal line 60 is a stack layer including Al/Ti/TiN and formed using a dry etching process.

Figure 2F:
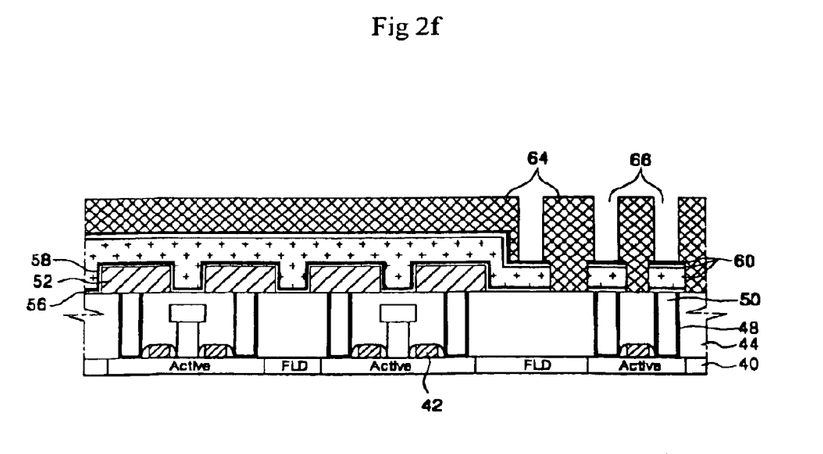

As shown in FIG. 2f, the first interlayer insulating layer 44 is exposed by sequentially etching the first metal line 60 and the second connection layer 58 through the patterned photoresist layer 62.

The second interlayer insulating layer 64 is formed on the resultant structure. Thereafter, contact holes 66 are formed on the second interlayer insulating layer 64 by a photolithography process to connect the first metal line 60.

Figure 2G:
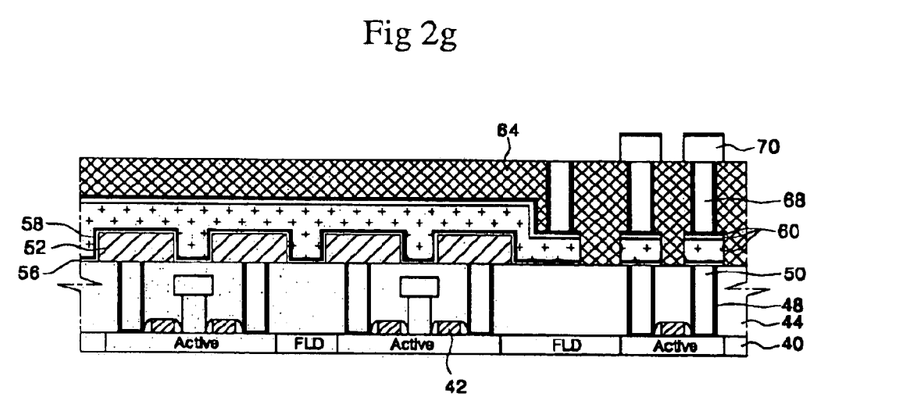

As shown in FIG. 2g, after a second plug 68 is formed in the contact holes 66, a second metal line 70 is formed on the second plug 68 for use in an interconnection.

As described above, by utilizing a method for manufacturing a capacitor in accordance with the present, it is possible to realize a high integration by utilizing aluminum oxide as a capacitor insulating layer having a high dielectric constant, improving characteristics of a semiconductor device by using a low temperature vapor deposition and low temperature annealing, improve leakage current characteristics by utilizing titanium as an upper electrode of the capacitor and reducing manufacturing costs by simplifying the capacitor manufacturing process.

While the present invention has been described with respect to the preferred embodiments, other modifications and variations may be made without departing from the spirit and scope of the present invention as set forth in the following claims.

What is claimed is:

1. A method for manufacturing a capacitor comprising the steps of:

forming a field region and an active region on a semiconductor substrate, thereafter forming first contact holes for connecting with the active region by stacking a first interlayer insulating layer on an entire region;

stacking a first connecting layer on the resultant structure;

filling metal in such a way that the first contact holes are buried to improve contact characteristics with the active region;

forming first plugs in the first contact holes by front etching;

forming a metal layer in the resultant structure;

forming a first photoresist layer by patterning on a portion for forming the capacitor and thereafter forming a capacitor by etching the metal layer;

forming a capacitor insulating layer on a top surface and a side surface of the capacitor and thereafter forming a second connecting layer;

forming a first metal line, patterning by stacking a second photoresist layer so as to block a capacitor region;

exposing the first interlayer insulating layer by sequentially etching the first metal line and the second connecting layer through the patterned second photoresist;

forming a second interlayer insulating layer on the resultant structure and thereafter forming second contact holes connected to the first metal line by a photolithography process; and forming second plugs in the second contact holes and thereafter forming a second metal line for use in an interconnection.

2. The method of claim 1, wherein the first connecting layer is a stacked layer including titanium (Ti)/titanium nitride (TiN) formed at a range of 50~150 Å/100~200Å, respectively.

3. The method of claim 1, comprising forming tungsten by a chemical vapor deposition method, and thereafter forming the first plugs by patterning using a dry etching process.

4. The method of claim 1, comprising forming the metal layer of aluminum at a temperature ranging from 300° C. to 500° C. at a thickness ranging from 3000 Å to 4000 Å.

5. The method of claim 1, comprising etching the metal layer using dry etching.

6. The method of claim 1, comprising forming the capacitor insulating layer by annealing an aluminum oxide ($Al_2O_3$) layer at a temperature ranging from 200° C. to 400° C. at a thickness ranging from 30 Å to 100 Å.

7. The method of claim 1, comprising forming the second connecting layer of titanium (Ti) with a thickness of 50 Å to about 150 Å.

8. The method of claim 1, wherein the first metal line is a stack layer made of Al/Ti/TiN.

9. The method of claim 1, comprising forming the first metal line by using a dry etching process.

* * * * *